(12) United States Patent
Lee

(10) Patent No.: US 6,266,280 B1
(45) Date of Patent: Jul. 24, 2001

(54) METHOD OF PROGRAMMING NONVOLATILE SEMICONDUCTOR DEVICE AT LOW POWER

(75) Inventor: Jong-Seuk Lee, Gyunggi-do (KR)

(73) Assignee: Hyundai Electronics Industries Co., Ltd., Gyunggi-do (KR)

( * ) Notice: Subject to any disclaimer, the term of this patent is extended or adjusted under 35 U.S.C. 154(b) by 0 days.

(21) Appl. No.: 09/342,618

(22) Filed: Jun. 29, 1999

(30) Foreign Application Priority Data

Jun. 30, 1998 (KR) .................................. 98-26211

(51) Int. Cl.$^7$ .................................................. G11C 16/04
(52) U.S. Cl. .................................. 365/185.26; 365/1
(58) Field of Search ..................... 365/185.26, 185.01, 365/185.14, 185.33

(56) References Cited

U.S. PATENT DOCUMENTS

| | | | |
|---|---|---|---|
| 5,586,073 | * 12/1996 | Hiura et al. | 365/185.01 |
| 5,602,789 | * 2/1997 | Endoh et al. | 365/201 |
| 5,751,631 | * 5/1998 | Liu et al. | 365/185.01 |
| 5,757,044 | * 5/1998 | Kubota | 257/316 |
| 5,847,992 | * 12/1998 | Tanaka et al. | 365/185.03 |
| 5,889,304 | * 3/1999 | Watanabe et al. | 257/321 |

FOREIGN PATENT DOCUMENTS 10-149688    6/1998    (JP) .

* cited by examiner

*Primary Examiner*—David Nelms
*Assistant Examiner*—Thong Le
(74) *Attorney, Agent, or Firm*—Crompton, Seager & Tufte, LLC

(57) ABSTRACT

A method of programming a nonvolatile semiconductor device at low power. A programming operation is performed by applying a high voltage to a gate of a selected memory cell to induce a strong electric field from a semiconductor substrate, applying a ground voltage to a drain of the selected cell and allowing a source of the selected cell to float. A desired voltage is applied to drains of nonselected memory cells not to program the nonselected memory cells. The desired voltage has half the level of the high voltage applied to the gate of the selected memory cell. Therefore, in a NOR-type flash memory, the programming operation is performed not in a hot-electron implantation manner, but in an F-N tunneling manner, so as to program a number of cells, more particularly on a page-by-page basis, at low power.

3 Claims, 3 Drawing Sheets

METHOD OF PROGRAMMING NONVOLATILE SEMICONDUCTOR DEVICE AT LOW POWER

BACKGROUND OF THE INVENTION

1. Field of the Invention

The present invention relates in general to a method of programming nonvolatile semiconductor devices, and more particularly to a method of programming a NOR-type flash memory at low power, in which a channel programming technique based on a Fowler-Nordheim (F-N) tunneling effect is employed to program cells in the flash memory at low power and high speed and make a simultaneous random access operation for the cells possible.

2. Description of the Prior Art

Generally, because nonvolatile memories have the advantage that data stored therein is subjected to no loss even though power is interrupted, they are widely used for the storage of data in a PC Bios, Set-top Box, printer, network server, etc. Recently, the nonvolatile memories have often been used even in fields such as a digital camera and cellular phone.

Among the nonvolatile memories, flash memories of an electrically erasable programmable read only memory (EEPROM) type have a function of erasing data in all memory cells in a lump. Such flash memories are classified into a NAND-type flash memory wherein at least two memory cell transistors are connected in series to one bit line and a NOR-type flash memory wherein at least two memory cell transistors are connected in parallel to one bit line.

FIGS. 1a and 1b are cross-sectional views illustrating a conventional method of programming a NOR-type flash memory, wherein FIG. 1b shows an initial state of one cell selected in a memory cell array and FIG. 1a shows a state of the selected cell after it is programmed.

With reference to FIGS. 1a and 1b, the flash memory comprises a floating gate 12 which is a first conductor layer formed on an insulating film (not shown). The insulating film is formed on an active area of a p-type silicon substrate 10 as a semiconductor substrate. A control gate 14 is formed over the floating gate 12 via an insulating film (not shown) The gates 12 and 14 are sequentially stacked in this manner. The flash memory further comprises a source S and drain D which are impurity-doped regions 16 formed by doping n-type impurities into portions of the active area in the neighborhood of edges of the stacked gates 12 and 14. Here, the control gate 14 is connected to a word line and the drain D is connected to a bit line.

The above-mentioned flash memory has a stacked gate structure and is programmed in a hot-electron implantation manner. In the case where the memory cell is at an erased state as shown in FIG. 1b, the floating gate 12 is filled with holes, thereby making a threshold voltage low in level. In the case where the memory cell is to be programmed as shown in FIG. 1a, a high voltage of about 12V is applied to the control gate 14, a voltage of 0V is applied to the source S and the half voltage of about 5V is applied to the drain D. As a result, a large amount of current flows from the source S to the drain D), resulting in hot electrons being generated in the neighborhood of edges of the drain D. The generated hot electrons are implanted into the floating gate 12 by the high voltage applied to the control gate 14. Then, the threshold voltage is raised by the hot electrons implanted into the floating gate 12, resulting in the memory cell being programmed.

FIG. 2 is a circuit diagram showing an array of the NOR-type flash memory in FIGS. 1a and 1b.

With reference to FIG. 2, most nonvolatile memories including the flash memory each have an array structure comprising a plurality of word lines WL1, WL2, . . . , Wln, a plurality of bit lines bit1, bit2, . . . , bitn and a common source line.

In the flash memory, cell threshold voltages are lowered by erasing information stored in all cells C11, C12, . . . , Cln, . . . Cnn. A desired cell to be programmed is selected among the memory cells and then subjected to a programming operation. If the selected memory cell has an address of 2,3 (row,column), the second word line WL2 is selected and applied with 12V and the third bit line bit3 is selected and applied with 5V. Also, 0V is applied to the common source line. Then, the cell C23 is programmed in the above-mentioned hot-electron implantation manner.

FIGS. 3a and 3b are views illustrating a cell sensing operation of the NOR-type flash memory in FIGS. 1a to 2, wherein FIG. 3a illustrates the operation of a sense amplifier 34 for sensing information from a programmed or erased cell. The sense amplifier 34 senses whether the associated memory cell is at a programmed state, on the basis of the fact that a programmed cell has a high threshold voltage level and an erased cell has a low threshold voltage level.

The sense amplifier 34 is adapted to perform the sensing operation in response to an output voltage Vmain from a cell 30 to be compared (referred to hereinafter as "comparison cell") and a reference voltage Vref from a reference voltage generator 32. As shown in FIG. 3b, the sense amplifier 34 compares the output voltage Vmain from the comparison cell 30 with the reference voltage Vref from the reference voltage generator 32 and outputs the compared result Sout indicative of whether the comparison cell 30 is at a programmed state Vp or at an erased state Ve.

The above-mentioned flash memory is disadvantageous in that it requires a large amount of current consumption in performing the programming operation and is difficult to program a number of cells at the same time. Further, the entire programming speed is low because the programming operation can be performed only on a byte-by-byte basis or a word (16 bits)-by-word basis.

On the other hand, a data read operation is carried out by selecting a desired one of a number of word lines, applying a supply voltage Vcc to the selected word line, selecting a desired one of a number of bit lines and applying a low voltage of about 1V to the selected bit line. In the case where the associated cell is at the erased state, a current path is formed from the selected bit line to a ground voltage terminal through the cell, resulting in the bit line being subjected to a current leakage and thus falling in voltage level. In the case where the associated cell is at the programmed state, it is not turned on although the supply voltage Vcc is applied to the word line. As a result, the bit line does not fall to low in level and thus remains high in level. This high level voltage on the bit line is compared with the reference voltage Vref, as shown in FIG. 3b, so that it can be read.

SUMMARY OF THE INVENTION

Therefore, the present invention has been made in view of the above problems, and it is an object of the present invention to provide a method of programming a nonvolatile semiconductor device at low power, in which a programming operation is performed in an F-N tunneling manner instead of a hot-electron implantation manner to program cells in the semiconductor device at low power and program a number of cells among them at the same time to reduce the entire programming time.

In accordance with the present invention, in a method of programming a NOR-type flash memory which comprises a memory cell array composed of a plurality of memory cells, each of the memory cells having a transistor including a multi-layer stacked gate, drain and source, there is provided a method of programming a nonvolatile semiconductor device at low power, comprising the step of programming information in a selected one of the memory cells by applying a high voltage to the gate of the selected memory cell to induce a strong electric field from a semiconductor substrate, applying a ground voltage to the drain of the selected cell and allowing the source of the selected cell to float.

Preferably, the programming step may include the step of applying a desired voltage to the drains of nonselected ones of the memory cells not to program the nonselected memory cells, the desired voltage having half the level of the high voltage applied to the gate of the selected memory cell.

In a feature of the present invention, a programming operation is performed in an F-N tunneling manner to program flash memory cells at low power and program a number of cells among them at the same time to reduce the entire programming time.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENTS

Figure 4:
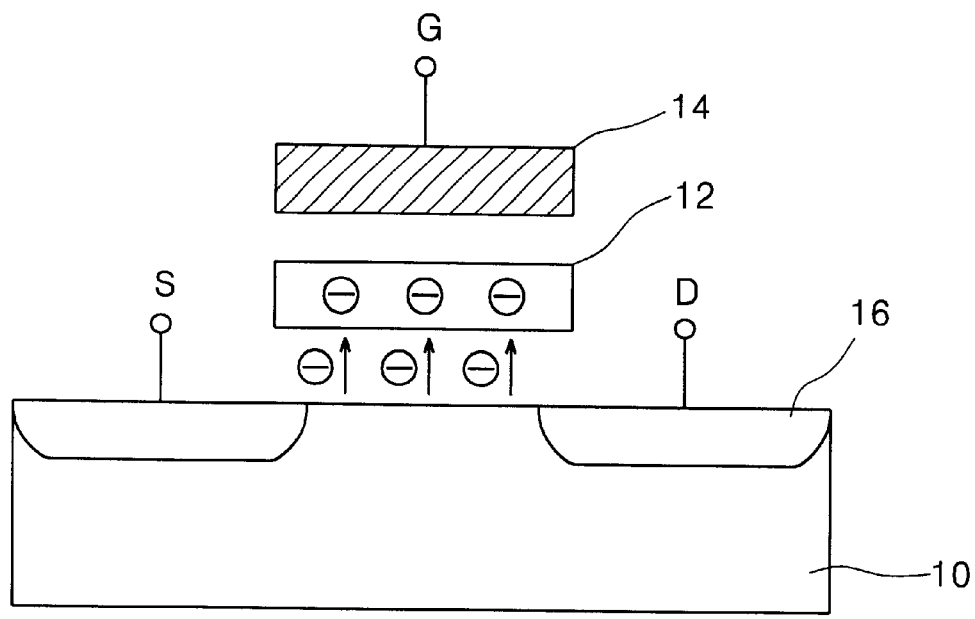
FIG. 4 is a cross-sectional view illustrating a method of programming a nonvolatile semiconductor device in accordance with the present invention.

FIG. 4 is a cross-sectional view illustrating a method of programming a nonvolatile semiconductor device in accordance with the present invention. According to the present invention, a programming operation is performed in an F-N tunneling manner instead of a hot-electron implantation manner. Therefore, bias conditions applied to cells for the programming are changed as follows.

For the purpose of inducing a strong electric field from a p-type silicon substrate 10, a high voltage is applied to a control gate 14 of a memory cell to be programmed. Also, a voltage of 0V is applied to a drain D of the same cell and a source S of the same cell floats. Information is programmed in the associated cell under this condition. In response to the high voltage being applied to the control gate 14, a strong electric field is generated from the substrate 10 and a channel region composed of electrons is formed on a portion of the substrate 10 under a floating gate 12. An F-N tunneling phenomenon occurs between the substrate 10 and the floating gate 12, so that the electrons of the channel region are implanted into the floating gate 12 via an insulating film (not shown) formed between the substrate 10 and the floating gate 12. At this time, a voltage to the drain D is an important factor in selectively programming cells. In other words, if a desired voltage, Vd, is applied to the drain D, the channel region has the voltage level of Vd. As a result, a voltage difference between the substrate 10 and the floating gate 12 is lowered, thereby causing the F-N tunneling phenomenon to vanish. Therefore, for the programming operation, nonselected cells, other than a selected cell, are not programmed by applying a voltage, which has half the level of a voltage to the gate, to the drains of the nonselected cells.

Figure 1A:
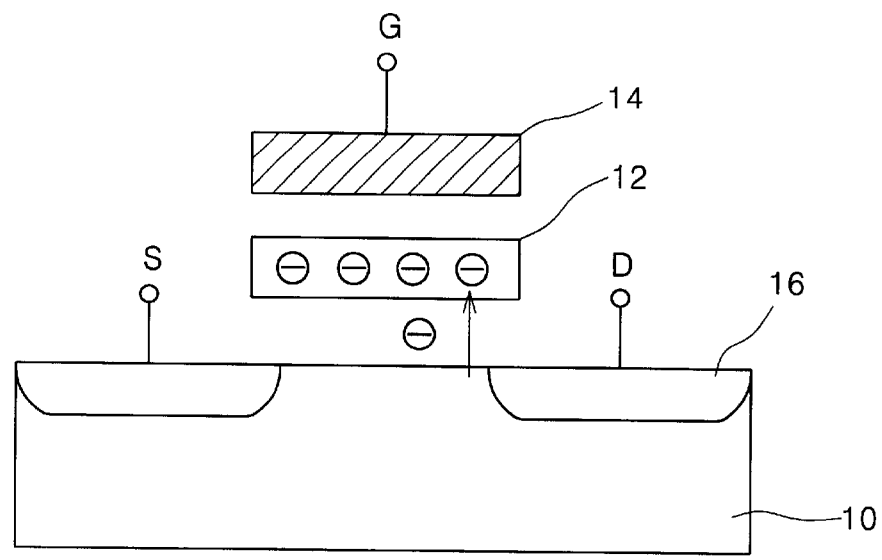
FIGS. 1a and 1b are cross-sectional views illustrating a conventional method of programming a NOR-type flash memory.
Figure 1B:
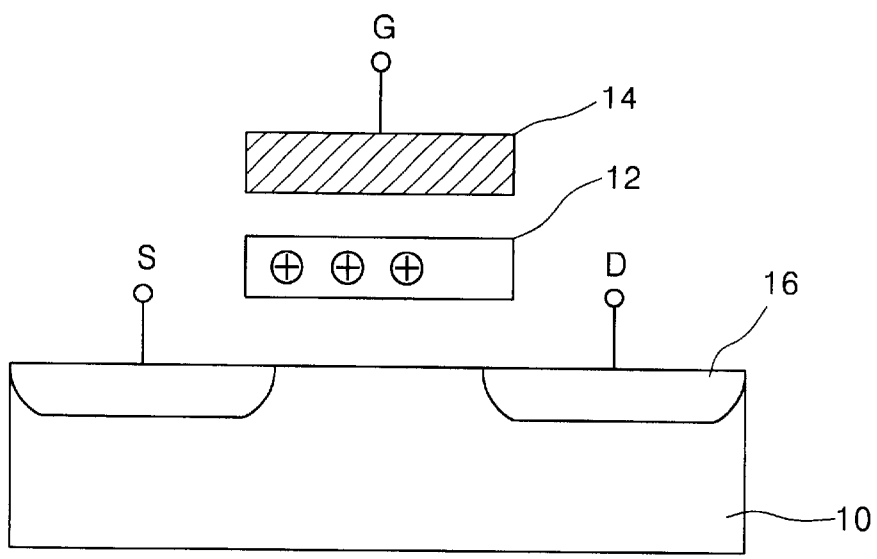
Figure 2:
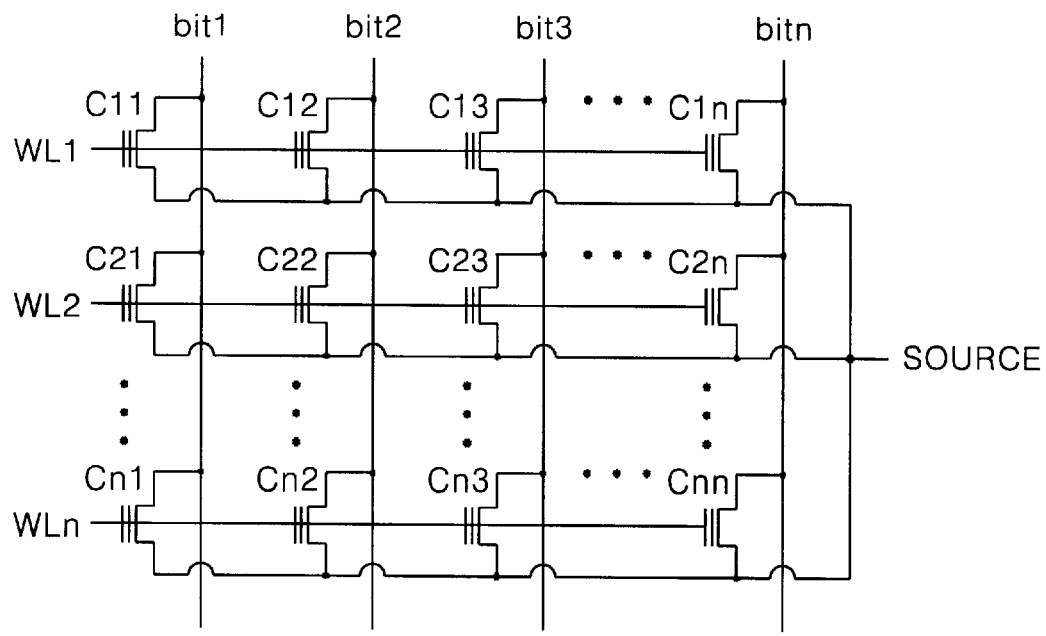
FIG. 2 is a circuit diagram showing an array of the NOR-type type flash memory in FIGS. 1a and 1b.
Figure 3A:
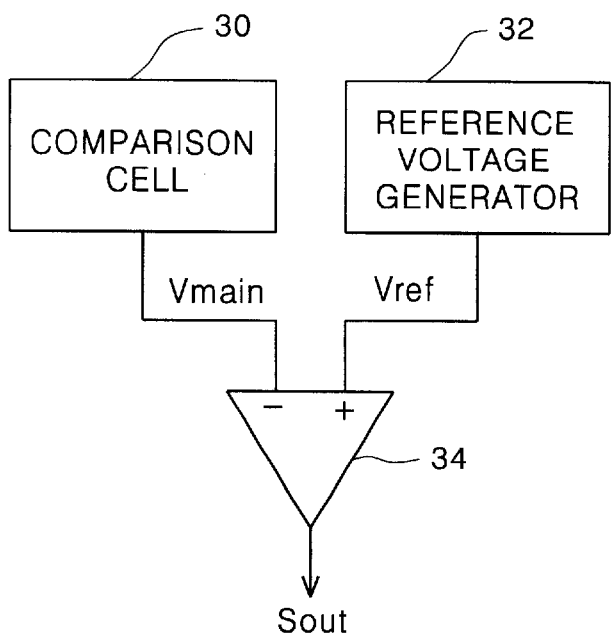
FIGS. 3a and 3b are views illustrating a cell sensing operation of the NOR-type flash memory in FIGS. 1a to 2.
Figure 3B:
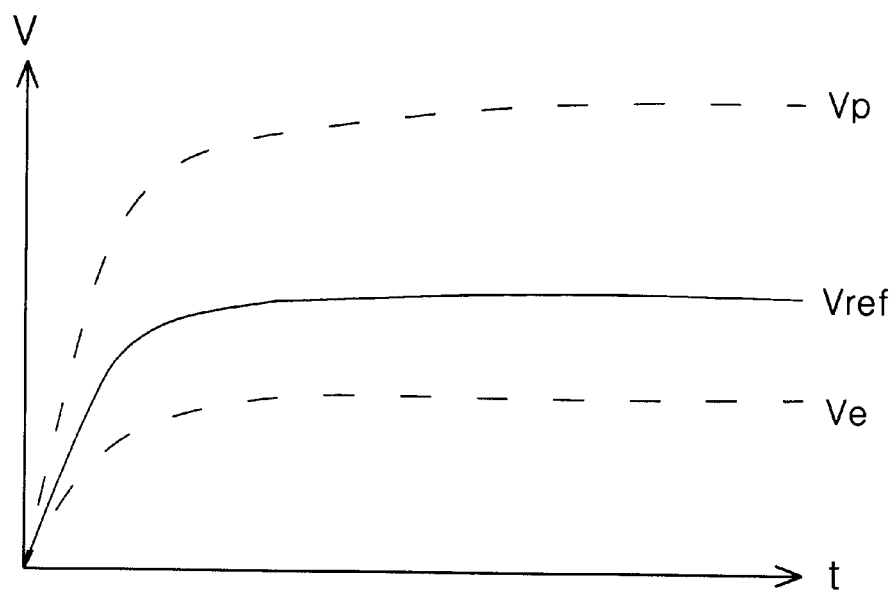

For example, assume that, in the NOR-type flash memory cell array as shown in FIG. 2, cells of addresses 1,1 and 1,3 are to be programmed. The selected first word line WL1 is applied with a bias voltage of 12V sufficient to cause the F-N tunneling phenomenon. As a result, the high voltage is applied to the gates of the cells C11, C12, . . . , C1n associated with the first row. Then, 0V is applied to the first bit line bit1 and third bit line bit3 and the half voltage of 5V is applied to the remaining bit lines bit2, bit4, . . . , bitn. Therefore, only the selected cells C11 and C13 are programmed and all the nonselected cells remain at their erased states.

On the other hand, according to the present invention, a random access operation can be performed for the reading of data, as in a general flash memory.

As apparent from the above description, according to the present invention, in a NOR-type flash memory with a stacked gate electrode structure, a programming operation is performed not in a hot-electron implantation manner, but in an F-N tunneling manner, so as to program a number of cells, more particularly on a page-by-page basis, at low power. Further, a large number of cells are programmed in parallel, resulting in a reduction in the entire programming time.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. In a method of programming a NOR-type flash memory which comprises a memory cell array composed of a plurality of memory cells, each of said memory cells having a transistor including a multi-layer stacked gate, a drain and a source, a method of programming a nonvolatile semiconductor device at low power, comprising the step of programming information in a selected one of said memory cells by applying a high voltage to said gate of said selected memory cell to induce a strong electric field from a semiconductor substrate, applying a ground voltage to said drain of said selected cell, allowing said source of said selected cell to float, and applying a desired voltage to said drains of nonselected ones of said memory cells not to program said nonselected memory cells, said desired voltage having approximately half the level of said high voltage applied to said gate of said selected memory cell.

2. The method of programming a nonvolatile semiconductor device at low power, as set forth in claim 1, wherein the step of programming information in a selected one of said memory cells by applying a high voltage to said gate of said selected memory cell to induce a strong electric field from a semiconductor substrate comprises applying a high voltage to a word line connected to said gate of said selected memory cell, and wherein the step of applying a ground voltage to said drain of said selected cell comprises the step of applying a ground voltage to a bit line connected to said drain of said selected cell, and wherein the step of applying a desired voltage to said drains of nonselected ones of said memory cells not to program said nonselected memory cells comprises the step of applying said desired voltage to said drains of nonselected ones of said memory cells not to program said nonselected memory cells comprises the step of applying said desired voltage to one or more bit lines connected to said drains of nonselected ones of said memory cells.

3. The method of programming a nonvolatile semiconductor device at low power, as set forth in claim 1, wherein said high voltage comprises approximately 12 volts, and wherein said desired voltage comprises approximately 5 volts.

* * * * *